(12) United States Patent
Kawakami

(10) Patent No.: US 9,097,977 B2
(45) Date of Patent: Aug. 4, 2015

(54) PROCESS SEQUENCE FOR REDUCING PATTERN ROUGHNESS AND DEFORMITY

(75) Inventor: Shinichiro Kawakami, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 200 days.

(21) Appl. No.: 13/572,005

(22) Filed: Aug. 10, 2012

(65) Prior Publication Data

US 2013/0309615 A1 Nov. 21, 2013

Related U.S. Application Data

(60) Provisional application No. 61/647,406, filed on May 15, 2012.

(51) Int. Cl.
*G03F 7/20* (2006.01)
*G03F 7/40* (2006.01)

(52) U.S. Cl.
CPC . *G03F 7/405* (2013.01); *G03F 7/40* (2013.01)

(58) Field of Classification Search
USPC .................................................. 430/328, 330
See application file for complete search history.

(56) References Cited

U.S. PATENT DOCUMENTS

| | | | |
|---|---|---|---|
| 6,582,891 B1 | 6/2003 | Hallock et al. | |
| 6,596,469 B2 | 7/2003 | McCullough et al. | |
| 6,627,388 B2 | 9/2003 | Lin et al. | |
| 6,709,807 B2 | 3/2004 | Hallock et al. | |
| 6,800,423 B2 | 10/2004 | Yokoyama et al. | |
| 6,905,811 B2 | 6/2005 | Chen et al. | |
| 6,924,084 B2 | 8/2005 | Wester | |
| 7,005,236 B2 | 2/2006 | Cheng et al. | |
| 7,897,325 B2 | 3/2011 | Sawada et al. | |
| 7,998,664 B2 | 8/2011 | Noya et al. | |
| 2003/0193624 A1 | 10/2003 | Kobayashi et al. | |
| 2004/0029396 A1 | 2/2004 | Zhang et al. | |
| 2005/0221222 A1 | 10/2005 | Ito et al. | |
| 2007/0010412 A1 | 1/2007 | Zhang et al. | |
| 2007/0072092 A1 | 3/2007 | Shimoaoki et al. | |
| 2008/0063984 A1 | 3/2008 | Zhang et al. | |
| 2008/0274433 A1 | 11/2008 | Takaki et al. | |
| 2008/0280230 A1 | 11/2008 | Chang | |
| 2008/0299487 A1 | 12/2008 | Chang | |
| 2009/0229637 A1 | 9/2009 | Yun et al. | |
| 2009/0317752 A1 | 12/2009 | Kobayashi et al. | |
| 2010/0003468 A1 | 1/2010 | Noya et al. | |
| 2010/0028817 A1 | 2/2010 | Noya et al. | |
| 2010/0233634 A1 | 9/2010 | Noya et al. | |
| 2010/0248164 A1 | 9/2010 | Kumagai et al. | |
| 2010/0304313 A1 | 12/2010 | Zhang et al. | |
| 2013/0040246 A1* | 2/2013 | Kawakami | 430/325 |
| 2013/0171571 A1* | 7/2013 | Dunn et al. | 430/325 |

FOREIGN PATENT DOCUMENTS

| | | |
|---|---|---|
| WO | 2008070060 A2 | 6/2008 |
| WO | 2012002519 A1 | 1/2012 |

OTHER PUBLICATIONS

International Searching Authority, International Search Report and Written Opinion issued in corresponding International Application No. PCT/US13/40880 issued Oct. 11, 2013, 11 pp.
The International Bureau of WIPO, International Preliminary Report on Patentability issued in counterpart International Application No. PCT/US2013/040880 dated Nov. 27, 2014, 10 pp.

* cited by examiner

*Primary Examiner* — Daborah Chacko Davis

(74) *Attorney, Agent, or Firm* — Wood, Herron & Evans, LLP

(57) ABSTRACT

A method for patterning a substrate with reduced defectivity is described. Once a pattern is formed in a layer of radiation-sensitive material using lithographic techniques, the pattern formed on the substrate is post-treated. The post-treating of the pattern in the layer of radiation-sensitive material is performed to reduce a roughness of the pattern. The post-treating includes performing a treatment process on the pattern to alter a solubility of an exposed surface of the pattern, wherein the treatment process involves performing a first chemical treatment of the pattern using a liquid-phase chemical solution containing a first surfactant, or exposing said pattern to second EM radiation different than said first EM radiation. Following the treatment process, the post-treating includes hard baking the pattern, and performing a second chemical treatment of the pattern using a vapor-phase chemical solution to reduce the roughness.

19 Claims, 9 Drawing Sheets

PROCESS SEQUENCE FOR REDUCING PATTERN ROUGHNESS AND DEFORMITY

CROSS-REFERENCE TO RELATED APPLICATIONS

Pursuant to 37 CFR §1.78(a)(4), this application claims the benefit of and priority to U.S. Provisional Application Ser. No. 61/647,406, filed on May 15, 2012, the entire content of which is herein incorporated by reference.

FIELD OF INVENTION

The invention relates to a method for patterning a thin film on a substrate, and more particularly to a method for reducing roughness of the pattern.

DESCRIPTION OF RELATED ART

In material processing methodologies, pattern etching comprises the application of a layer of radiation-sensitive material, such as photo-resist, to an upper surface of a substrate, the formation of a pattern in the layer of radiation-sensitive material using photo-lithography, and the transfer of the pattern formed in the layer of radiation-sensitive material to an underlying thin film on the substrate using an etching process. The patterning of the radiation-sensitive material generally involves exposure of the radiation-sensitive material to a pattern of electromagnetic (EM) radiation using, for example, a photo-lithography system, followed by the removal of the irradiated regions of the radiation-sensitive material (as in the case of positive tone resist), or non-irradiated regions (as in the case of negative tone resist) using a developing solution.

As the critical dimension (CD) decreases and the aspect ratio of the patterns formed in a layer of radiation-sensitive material increases, the potential for pattern defects including, but not limited to, pattern collapse, line edge roughness (LER), and line width roughness (LWR), becomes increasingly enhanced. In most situations, excessive pattern defects are unacceptable and, in some instances, catastrophic.

SUMMARY OF THE INVENTION

Embodiments of the invention relate to a method and system for preparing a pattern in a layer on a substrate, and more particularly to a method and system for preparing a pattern formed in a layer on a substrate, wherein the pattern has reduced defectivity. Embodiments of the invention further relate to a method and system for treating a pattern formed in a layer on a substrate to reduce pattern collapse and pattern deformities, such as line edge roughness (LER) and line width roughness (LWR).

According to one embodiment, a method for patterning a substrate with reduced defectivity is described. Once a pattern is formed in a layer of radiation-sensitive material using lithographic techniques, the pattern formed on the substrate is post-treated. The post-treating of the pattern in the layer of radiation-sensitive material is performed to reduce a roughness of the pattern. The method of performing the post-treating includes performing a treatment process on the pattern to alter a solubility of an exposed surface of the pattern, wherein the treatment process involves performing a first chemical treatment of the pattern using a liquid-phase chemical solution containing a first surfactant, or exposing the pattern to second EM radiation different than the first EM radiation. Following the treatment process, the method of performing the post-treating includes hard baking the pattern at a hard bake temperature that is less than the glass transition temperature of the layer of radiation-sensitive material. Thereafter, a second chemical treatment of the pattern is performed using a vapor-phase chemical solution to reduce the roughness.

According to another embodiment, a method for patterning a substrate is described. The method includes: providing a substrate having a layer of radiation-sensitive material formed thereon and a pattern formed therein, the pattern having been formed by coating the substrate with the layer of radiation-sensitive material, exposing the layer of radiation-sensitive material to first electromagnetic (EM) radiation according to an image pattern, developing the layer of radiation-sensitive material to form the pattern therein from the image pattern, and rinsing the pattern; following the rinsing of the pattern, promoting swelling of at least a portion of the pattern by exposing a surface of the pattern to a liquid-phase chemical solution containing a surfactant to increase a solubility of the pattern; cross-linking at least a portion of the pattern by hard baking the pattern to decrease a solubility of the pattern; and smoothing the pattern by exposing the pattern to a vapor-phase chemical solution to remove or redistribute at least a portion of the pattern where a solubility of the pattern has been increased.

According to yet another embodiment, a method for patterning a substrate is described. The method includes: providing a substrate having a layer of radiation-sensitive material formed thereon and a pattern formed therein, the pattern having been formed by coating the substrate with the layer of radiation-sensitive material, exposing the layer of radiation-sensitive material to first electromagnetic (EM) radiation according to an image pattern, developing the layer of radiation-sensitive material to form the pattern therein from the image pattern, and rinsing the pattern; de-protecting at least a portion of the pattern by exposing a surface of the pattern to second EM radiation to increase a solubility of the pattern; cross-linking at least a portion of the pattern by hard baking the pattern to decrease a solubility of the pattern; and smoothing the pattern by exposing the pattern to a vapor-phase chemical solution to remove or redistribute at least a portion of the pattern where a solubility of the pattern has been increased.

DETAILED DESCRIPTION OF SEVERAL EMBODIMENTS

Figure 1A:
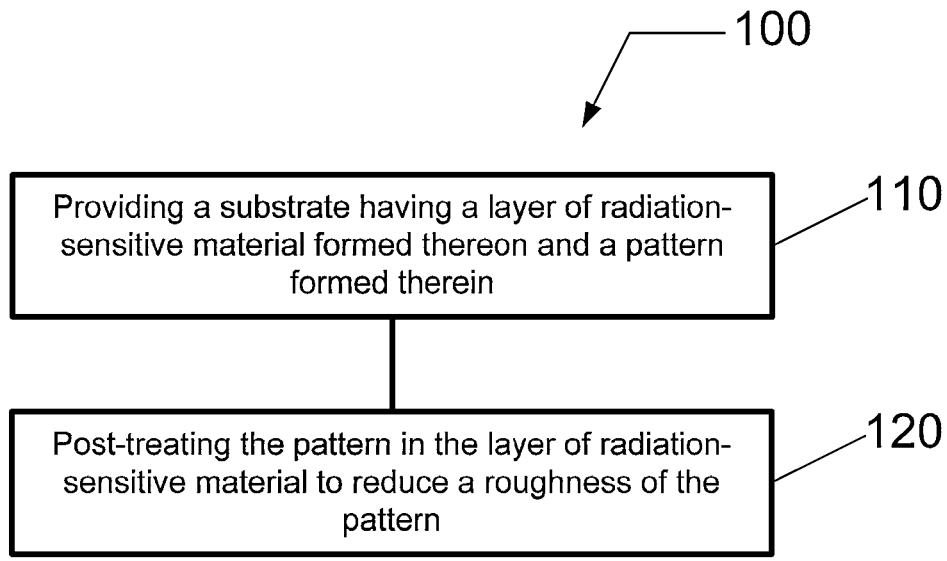
FIG. 1A illustrates a method of patterning a substrate according to an embodiment.

A method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

"Substrate" as used herein generically refers to the object being processed in accordance with embodiments of the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

To increase productivity in lithographic patterning for semiconductor manufacturing, for example, a method and system are described to address some or all of the above-described circumstances. In particular, it is important, among other things, to: (i) produce the pattern having reduced or substantially no pattern roughness (e.g., line-edge roughness (LER), or line-width roughness (LWR)), precipitation-based defects, or other pattern deformities, and (ii) prevent pattern collapse.

Referring now to the drawings, wherein like reference numerals designate identical or corresponding parts throughout the several views, FIG. 1A illustrates a method for patterning a substrate according to an embodiment. The method is illustrated in a flow chart 100, and begins in 110 with providing a substrate having a layer of radiation-sensitive material formed thereon and a pattern formed therein. The layer of radiation-sensitive material may include a photo-sensitive material, such as photo-resist. For example, the layer of radiation-sensitive material may comprise a 248 nm (nanometer) resist, a 193 nm resist, a 157 nm resist, an EUV (extreme ultraviolet) resist, or an electron beam sensitive resist. Furthermore, for example, the layer of radiation-sensitive material may comprise a thermal freeze photo-resist, an electromagnetic (EM) radiation freeze photo-resist, or a chemical freeze photo-resist.

The layer of radiation-sensitive material may be formed by coating, e.g., spin-coating, the material onto the substrate. The layer of radiation-sensitive material may be formed using a track system. For example, the track system can comprise a Clean Track ACT® 8, ACT® 12, LITHIUS®, LITHIUS Pro™, or LITHIUS Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more post-application bakes (PAB) to heat the substrate and one or more cooling cycles to cool the substrate following the one or more PABs.

After forming the layer of radiation-sensitive material, the layer of radiation-sensitive material is exposed to electromagnetic (EM) radiation (first EM radiation) according to an image pattern. The radiation exposure system may include a dry or wet photo-lithography system. The image pattern may be formed using any suitable conventional stepping lithography system, or scanning lithography system. For example, a photo-lithography system is commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the image pattern may be formed using an electron beam lithography system.

Once imaged, the layer of radiation-sensitive material is developed to form the pattern therein from the image pattern. The pattern may be characterized by a nominal critical dimension (CD), a nominal line edge roughness (LER), and/or a nominal line width roughness (LWR). The pattern may include a line pattern, or via pattern, or combination thereof. The developing process can include exposing the substrate to a developing solution in a developing system, such as a track system. For example, the developing solution may include tetramethyl ammonium hydroxide (TMAH) or tetrabutyl ammonium hydroxide (TBAH). Alternatively, for example, the developing solution may include other alkaline solutions, such as a sodium hydroxide solution, a potassium hydroxide solution, etc. Additionally, for example, the track system can comprise a Clean Track ACT® 8, ACT® 12, LITHIUS®, LITHIUS Pro™, or LITHIUS Pro V™ resist coating and developing system commercially available from Tokyo Electron Limited (TEL). The developing process may be preceded by one or more post-exposure bakes (PEB) to heat the substrate and one or more cooling cycles to cool the substrate following the one or more PEBs.

Thereafter, the substrate may be rinsed with a rinse solution. The rinse solution may include water, such as deionized (DI) water, or an aqueous solution containing a surfactant dissolved in water. The rinse solution may be used to displace and/or remove residual developing solution from the substrate. Preferably, the rinse solution contains only water. When the rinse solution contains only water (without surfactant), variations in the nominal CD may be prevented or minimized. After the developing process, the presence of developing solution on the pattern causes swelling of the pattern and increased permeability. As a result, when the rinse solution contains a surfactant, the rinse solution permeates into the pattern more freely, thus, causing variations in the nominal CD. In other words, rinsing the pattern on the substrate with only water, performed prior to additional chemical treatment, replaces the developing solution on the substrate with water and washes away the developing solution, thus, restraining variation in the nominal CD.

In 120, the pattern in the layer of radiation-sensitive material is post-treated to reduce a roughness of the pattern, such as the nominal line edge roughness (LER) and/or a nominal line width roughness (LWR) of the pattern.

Figure 1B:
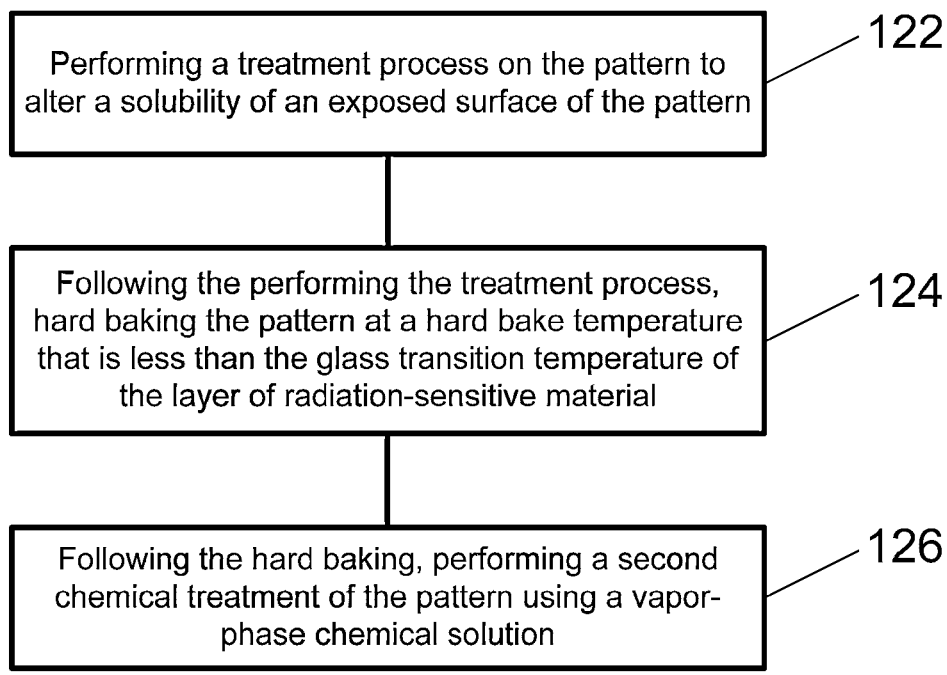
FIG. 1B illustrates a method of patterning a substrate according to another embodiment.

As illustrated in FIG. 1B, the post-treatment of the layer of radiation-sensitive material to reduce the roughness of the pattern includes a process sequence beginning in 122 with performing a treatment process on the pattern to alter a solubility of an exposed surface of the pattern.

According to one embodiment, the treatment process for altering a solubility of an exposed surface of the pattern may include performing a first chemical treatment of the pattern using a liquid-phase chemical solution, wherein the liquid-phase chemical solution contains a first surfactant.

The treatment process may include a second chemical treatment, or one or more additional chemical treatments that are performed following the rinsing of the substrate to reduce and/or improve pattern collapse and pattern deformities, such as line edge roughness (LER) and line width roughness (LWR). The second chemical treatment of the pattern may use a liquid-phase chemical solution, wherein the liquid-phase chemical solution contains a second surfactant.

The first chemical treatment may include dispensing an anionic, a nonionic, a cationic, and/or amphoteric surfactant. Suitable anionic surfactants include sulfonates, sulfates, carboxylates, phosphates, and mixtures thereof. Suitable cationic surfactants may include: alkali metals, such as sodium or potassium; alkaline earth metals, such as calcium or magnesium; ammonium; or substituted ammonium compounds, including mono-, di- or tri-ethanolammonium cation compounds; or mixtures thereof.

As an example, the first chemical treatment may include dispensing an aqueous solution containing a polyethylene glycol-based or acetylene glycol-based surfactant having a molecular weight of 1600 or less and a carbon number of its hydrophobic group of 10 or greater. It may be desirable that the hydrophobic group of the surfactant is not double-bonded or triple-bonded.

As another example, the liquid-phase chemical solution may include one or more surfactant solutions selected from the FIRM™ family of surfactants (e.g., FIRM™-A, FIRM™-B, FIRM™-C, FIRM™-D, FIRM™ Extreme 10, FIRM™ SPC400-7, etc.) co-developed by Tokyo Electron Limited (TEL) and Clariant (Japan) KK (Bunkyo-ku, Tokyo, Japan) (a subsidiary of Swiss manufacturer Clariant).

As another example, the liquid-phase chemical solution may include a mixture of an amine compound and a surfactant.

As yet another example, the liquid-phase chemical solution may be selected to reduce pattern collapse. For example, a liquid-phase chemical solution containing a first surfactant may be selected to reduce line edge roughness (LER) and/or line width roughness (LWR), and another liquid-phase chemical solution containing a second surfactant may be selected to reduce pattern collapse.

Additional details for a surfactant-containing rinse process for reducing roughness may be found in U.S. patent application Ser. No. 13/206,441, entitled "Multiple Chemical Treatment Process for Reducing Pattern Defect" and filed on Aug. 9, 2011.

According to another embodiment, the treatment process for altering a solubility of an exposed surface of the pattern may include exposing the pattern to second EM radiation different than the first EM radiation to which the substrate was exposed when forming the pattern.

The second EM radiation may include ultraviolet (UV) radiation. The second EM radiation may include UV radiation at a wavelength within the range of about 260 nm (nanometers) to about 350 nm. The second EM radiation may include a flood exposure of the layer of radiation-sensitive material on the substrate to the second EM radiation.

In 124, following the performing the treatment process, the pattern is hard baked at a hard bake temperature that is less than the glass transition temperature of the layer of radiation-sensitive material. Furthermore, the hard bake temperature may be greater than the temperature set for the post-exposure bake (PEB) that follows exposure of the layer of radiation-sensitive material to the first EM radiation during imaging, and precedes exposure of the layer of radiation-sensitive material to the developing solution during developing. The PEB temperature and the glass transition temperature depend on the layer of radiation-sensitive material selected for patterning (i.e., the selected photo-resist). For example, the hard bake temperature may be greater than or equal to 100 degrees C. Alternatively, for example, the hard bake temperature may be greater than or equal to 150 degrees C. Additionally, for example, the hard bake temperature may be less than or equal to 170 degrees C. Alternatively, for example, the hard bake temperature may be less than or equal to 160 degrees C. For example, the hard bake temperature may range from about 100 degrees C. to about 200 degrees C., or about 100 degrees C. to about 170 degrees C., or about 120 degrees C. to about 170 degrees C., or about 150 degrees C. to about 170 degrees C., or about 150 degrees C. to about 160 degrees C., or about 155 degrees C.

The hard bake temperature, the hard bake time during which the substrate is elevated to the hard bake temperature, and the environment within which the substrate is elevated to the hard bake temperature may be varied. The hard bake time may range up to 300 seconds (sec). Alternatively, the hard bake time may range up to 120 sec. Alternatively, the hard bake time may be about 60 sec.

Then, in 126, a second chemical treatment of the pattern is performed using a vapor-phase chemical solution. The vapor-phase chemical solution of the second chemical treatment may include N-Methylpyrrolidone or N-Methyl-2-pyrrolidone. For example, the substrate may be exposed to an atomized spray of a treatment solution. The vapor-phase environment reacts with the exposed portions of the layer of radiation-sensitive material to cause "melting" or reflowing of the radiation-sensitive material and, thus, smoothing of the exposed surface of the layer of radiation-sensitive material. Following the second chemical treatment, the substrate may be exposed to one or more additional vapor-phase treatment solutions to further reduce the roughness.

Additionally, the substrate may be heated to elevate the temperature of the substrate during the exposing of the pattern on the substrate to the vapor-phase chemical solution. The temperature of the substrate may range from about 20 degrees C. to about 100 degrees C., and may preferably range from about 30 degrees C. to about 50 degrees C. Furthermore, the substrate may be irradiated with electromagnetic (EM) radiation during the exposing of the pattern on the substrate to the vapor-phase chemical solution. In this process step, the concentration of the vapor-phase chemical solution, the temperature of the substrate, the pressure for the vapor-phase environment, and the time for exposure are process parameters that may be adjusted to achieve roughness reduction or control.

Additional details for a vapor-phase chemical solution process for reducing roughness may be found in U.S. patent application Ser. No. 13/342,313, entitled "Vapor Treatment Process for Pattern Smoothing with Inline Critical Dimension Slimming" and filed on Jan. 3, 2012.

Thereafter, the pattern may optionally be thermally treated. Or, alternatively, the pattern may optionally be subjected to other treatment including exposure to EM radiation.

The method of patterning a substrate may further comprise characterizing the roughness by determining a nominal roughness assessed immediately prior to the post-treatment process and determining a post-treatment roughness assessed immediately following the post-treatment process, and achieving a reduction in the roughness exceeding 10%, wherein the reduction in the roughness is measured as a percentile ratio of a difference between the nominal roughness and the post-treatment roughness to the nominal treatment roughness. Further yet, the post-treatment process may achieve a reduction in the roughness exceeding 30%. Even further yet, the post-treatment process may achieve a reduction in the roughness exceeding 50%.

Figure 4:
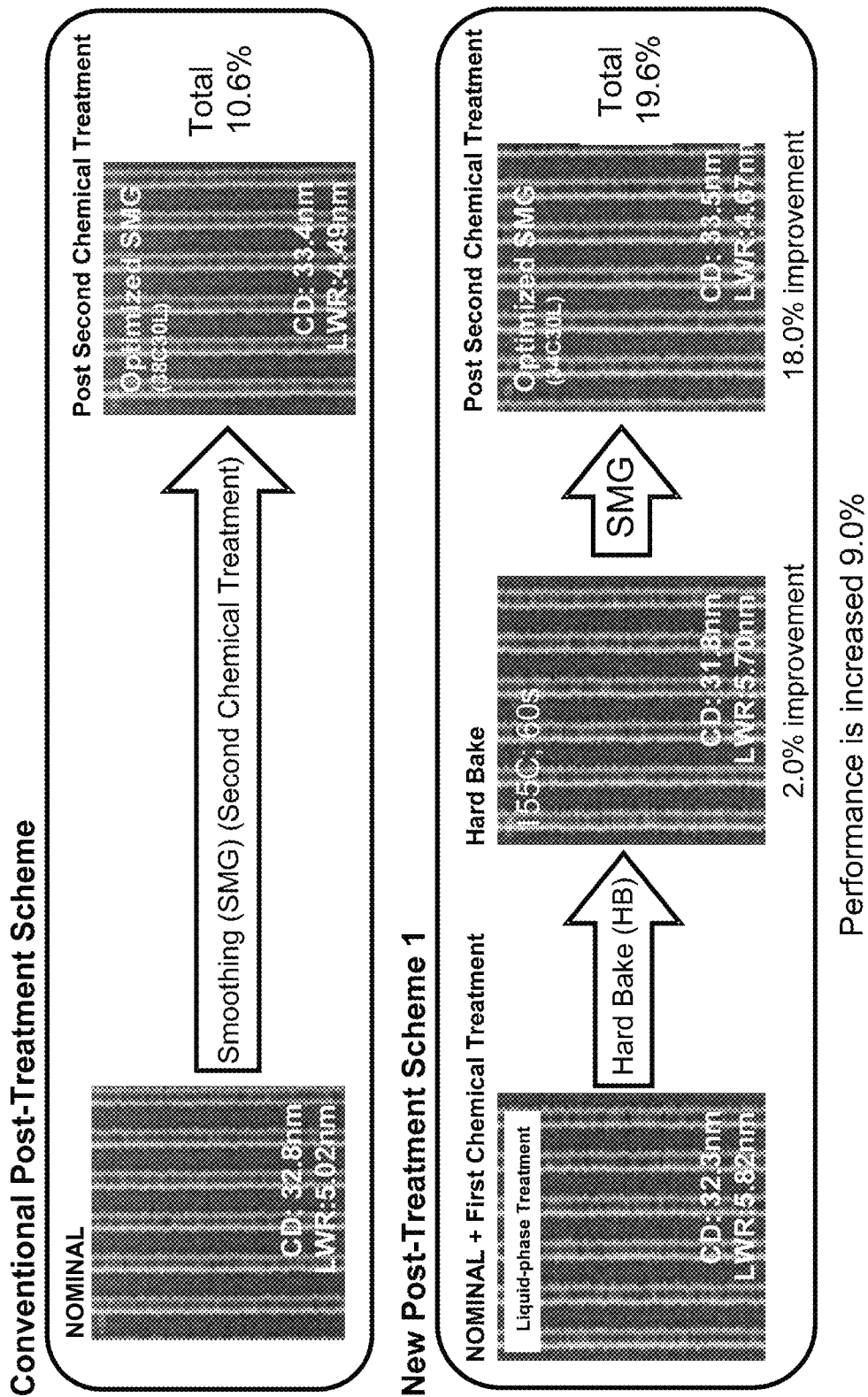
FIGS. 4 through 8 provide exemplary data for reducing roughness when patterning a substrate.

FIGS. 4 through 9 provide exemplary data for reducing roughness, such as LER or LWR, when patterning a substrate using the method depicted in FIGS. 1A and 1B. In FIG. 4, a first post-treatment scheme ("New Post-Treatment Scheme 1") is performed on a line pattern formed in an EUV resist, and compared to the result obtained for a conventional post-treatment scheme ("Conventional Post-Treatment Scheme") on the same line pattern formed in the same resist composition. The resist includes SEVR-139 resist (75 nm film thickness), and the line pattern has a target CD of 32 nm and a target pitch of 70 nm.

Figure 2:
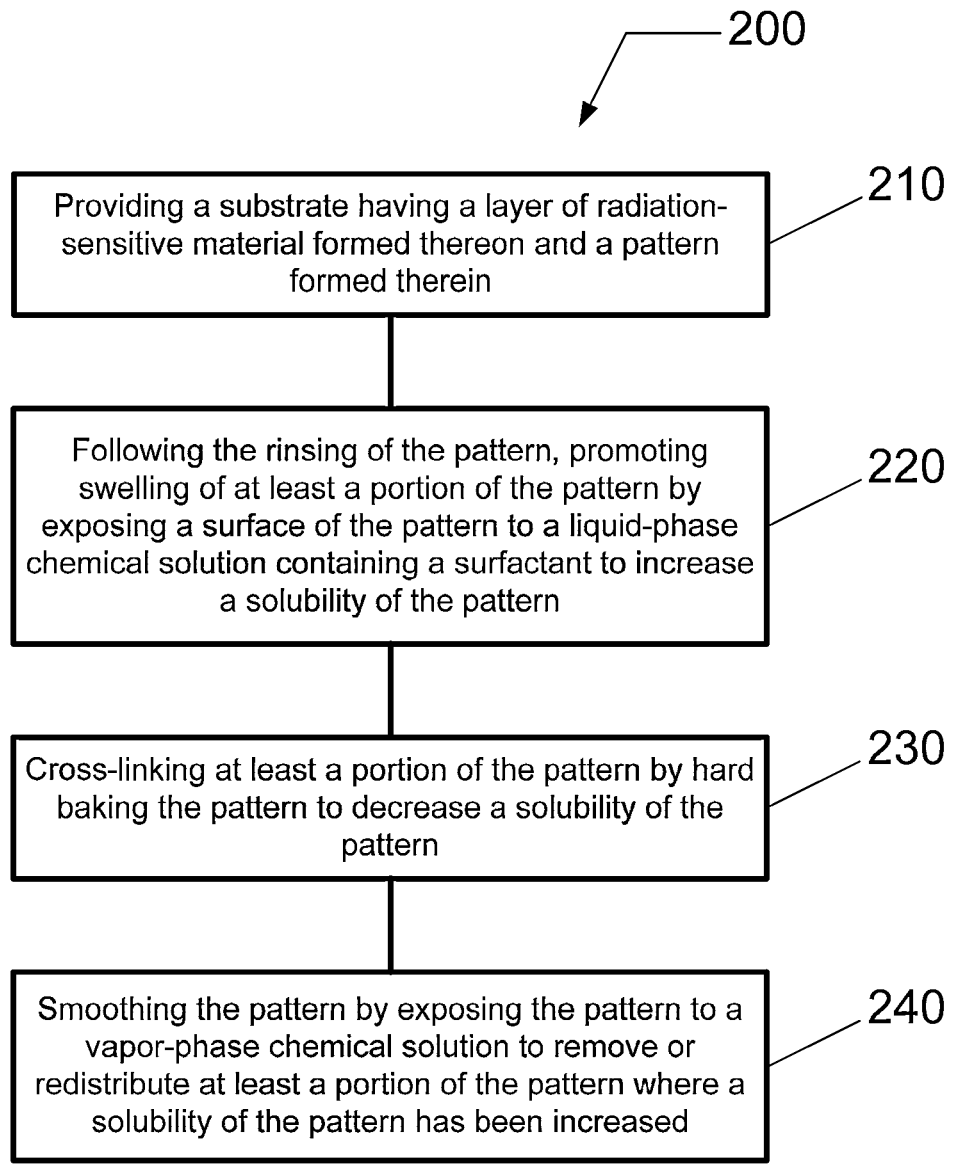
FIG. 2 illustrates a method of patterning a substrate according to another embodiment.

The first post-treatment scheme includes a process sequence 200 for reducing pattern roughness and deformity, as shown in FIG. 2. Process sequence 200 may include: in 210, providing a substrate having a layer of radiation-sensitive material formed thereon and a pattern formed therein, the pattern having been formed by coating the substrate with the layer of radiation-sensitive material, exposing the layer of radiation-sensitive material to first electromagnetic (EM) radiation according to an image pattern, developing the layer of radiation-sensitive material to form the pattern therein from the image pattern, and rinsing the pattern; in 220, following the rinsing of the pattern, promoting swelling of at least a portion of the pattern by exposing a surface of the pattern to a first chemical treatment that includes a liquid-phase chemical solution containing a surfactant to increase a solubility of the pattern; in 230, cross-linking at least a portion of the pattern by hard baking the pattern to decrease a solubility of the pattern; and in 240, smoothing the pattern by exposing the pattern to second chemical treatment that includes a vapor-phase chemical solution to remove or redistribute at least a portion of the pattern where a solubility of the pattern has been increased.

Therein, the pattern is exposed to a FIRM™-based liquid-phase chemical solution (step 220), hard baked at 155 degrees C. for 60 seconds (step 230), and exposed to NMP vapor at a substrate temperature of about 34 degrees C. to about 38 degrees C. The exposure of the pattern to the vapor-phase chemical solution may be adjusted to produce optimal results in the pattern. In the New Post-Treatment Scheme 1, the pattern is exposed to 30 loops of NMP vapor at 34 degrees C. Each loop in the exposure of the pattern to the NMP vapor includes a first time duration during which the pattern is exposed to the NMP vapor, followed by a second time duration during which the pattern is not exposed to the NMP vapor. As an example, during an exposure loop, the first time duration may be about ten seconds, and the second time duration may be about ten seconds. Although, the first and second time durations may be more or less, and these time durations do not necessarily need to be equivalent.

The Conventional Post-Treatment Scheme omits steps 220 and 230 (e.g., exposing the pattern to a liquid-phase chemical solution containing a surfactant, and hard-baking the pattern), and includes only step 240 in part (i.e., smoothing the pattern by exposing the pattern to a vapor-phase chemical solution). The exposure of the pattern to the vapor-phase chemical solution may be adjusted to produce optimal results in the pattern. In the Conventional Post-Treatment Scheme, the pattern is exposed to 30 loops of NMP vapor at 38 degrees C. As shown in the SEM images of FIG. 4, when applying the Conventional Post-Treatment Scheme, the line pattern has a nominal CD of 32.8 nm and a nominal LWR of 5.02 nm. After application of the Conventional Post-Treatment Scheme, the final CD is 33.4 nm and the final LWR is 4.49 nm, which represents a 10.6% reduction of the LWR (measured as the percentile ratio of the difference between the final LWR and nominal LWR relative to the nominal LWR).

For comparison, after application of the New Post-Treatment Scheme 1, the final CD is 33.5 nm and the final LWR is 4.67 nm, which represents a 19.6% reduction of the LWR (measured as the percentile ratio of the difference between the final LWR and nominal LWR relative to the nominal LWR). The New Post-Treatment Scheme 1 improves the reduction of LWR by 9%.

To demonstrate the importance of including the exposure of the pattern to first chemical treatment, which includes the liquid-phase chemical solution (step 220), coupled with and preceding the hard baking (step 230), a series of experiments (e.g., "Process-A", "Process-B", "Process-C", "Process-D", and "Process-E") were performed using various post-treatment schemes with the same line pattern formed in the same resist composition having a nominal CD of 32 nm and nominal pitch of 70 nm.

The post-treatment schemes include the following: (A) Process-A includes only the second chemical treatment (using a vapor-phase chemical solution containing NMP vapor); (B) Process-B includes process optimization of the development step and the second chemical treatment; (C) Process-C includes process optimization of the development step, exposure of the pattern to the first chemical treatment (using a liquid-phase chemical solution containing FIRM™ Extreme10 (Ext10)), and the second chemical treatment; (D) Process-D includes process optimization of the development step, exposure of the pattern to the first chemical treatment (using a liquid-phase chemical solution containing FIRM™ Extreme10 (Ext10)), hard baking of the pattern (at 150 degrees C. for 60 seconds), and the second chemical treatment; and (E) Process-E includes process optimization of the development step, exposure of the pattern to the first chemical treatment (using a liquid-phase chemical solution containing FIRM™ SPC400), hard baking of the pattern (at 155 degrees C. for 60 seconds), and the second chemical treatment. Process optimization of the development step may include adjustment of any one of the following: chemical composition of the developing solution, temperature of the developing solution, dispensing properties of the developing solution, developing time, post-exposure bake temperature, post-exposure bake time, exposure dose, or exposure focus, or any combination thereof.

Figure 5A:
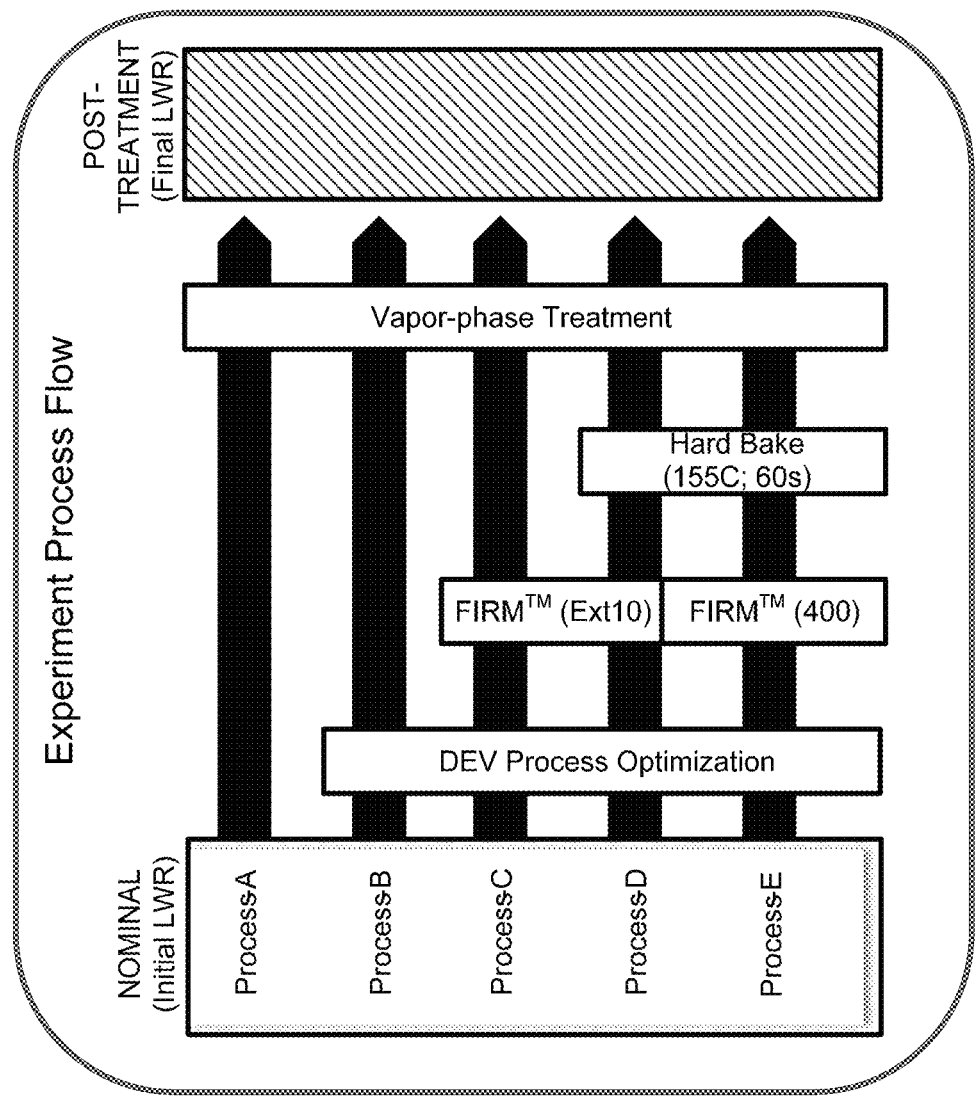
Figure 5B:
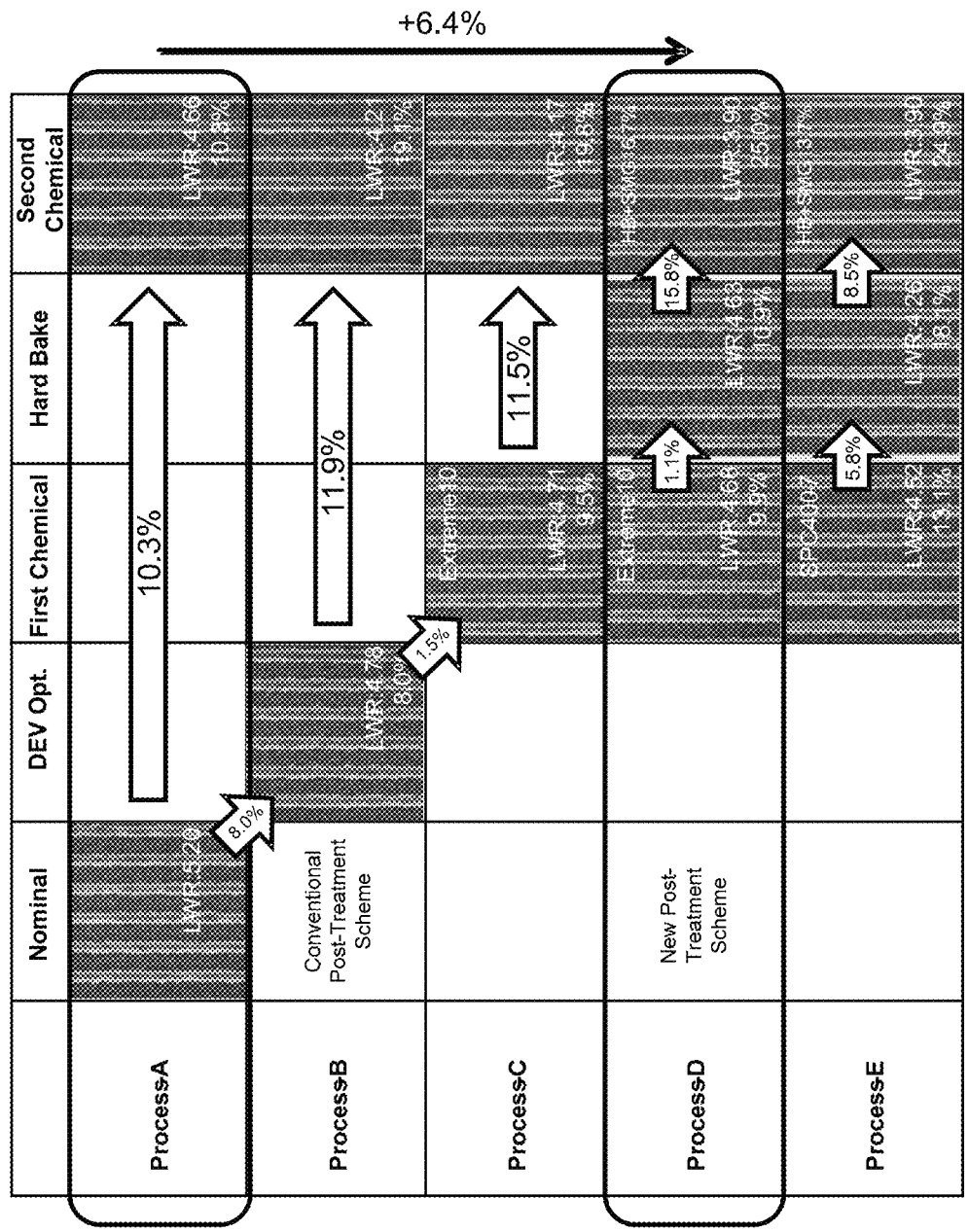

As shown in the SEM images of FIG. 5B, Process-D and Process-E, which include the first chemical treatment coupled with and preceding the hard baking of the pattern produce the optimal results in LWR reduction. For example, Process-A produces a LWR reduction of 10.3% from a nominal LWR of 5.20 nm to a final LWR of 4.66 nm. With development process optimization, Process-B produces a LWR reduction of 19.1% from a nominal LWR of 5.20 nm to a final LWR of 4.21 nm. When a first chemical treatment is performed without hard baking the pattern thereafter, Process-C produces a LWR reduction of 19.8% from a nominal LWR of 5.20 nm to a final LWR of 4.17 nm. However, when a first chemical treatment is performed with hard baking the pattern thereafter, Process-D (using FIRM™ Ext10) produces a LWR reduction of 25.0% from a nominal LWR of 5.20 nm to a final LWR of 3.90 nm, and Process-D (using FIRM™ SPC400) produces a LWR reduction of 24.9% from a nominal LWR of 5.20 nm to a final LWR of 3.90 nm.

Figure 6:
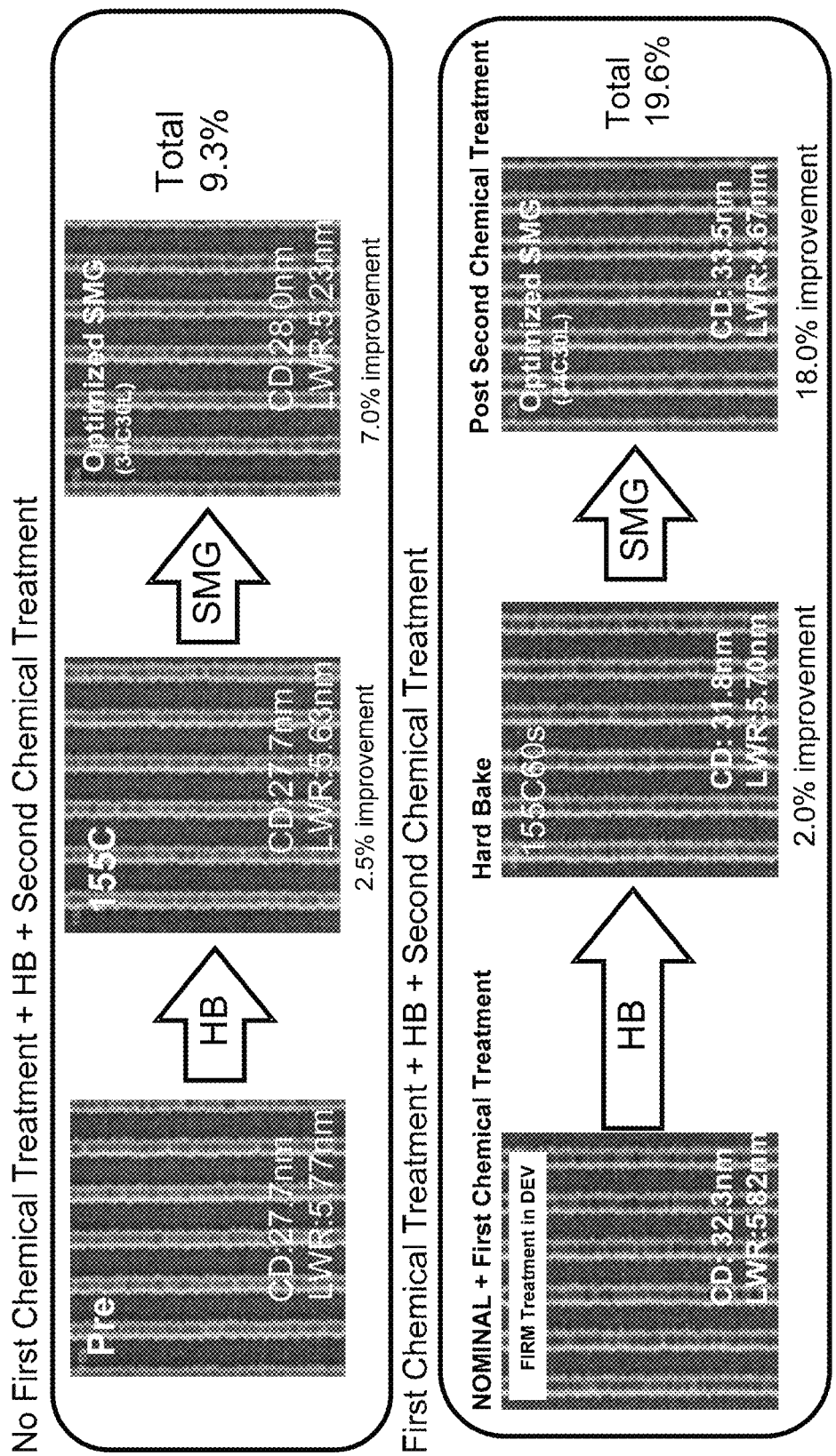

To further demonstrate the importance of including the exposure of the pattern to the liquid-phase chemical solution (step 220) coupled with and preceding the hard baking (step 230), FIG. 6 presents a first set of SEM images excluding the first chemical treatment ("No First Chemical Treatment+ HB+Second Chemical Treatment") that was compared with a second set of SEM images including the first chemical treatment ("First Chemical Treatment+HB+Second Chemical Treatment"). In the first set of SEM images, the nominal LWR of 5.77 nm is reduced to a final LWR of 5.23 nm representing a 9.3% reduction in LWR. In the second set of SEM images, the nominal LWR of 5.82 nm is reduced to a final LWR of 4.67 nm representing a 19.6% reduction in LWR.

Figure 7:
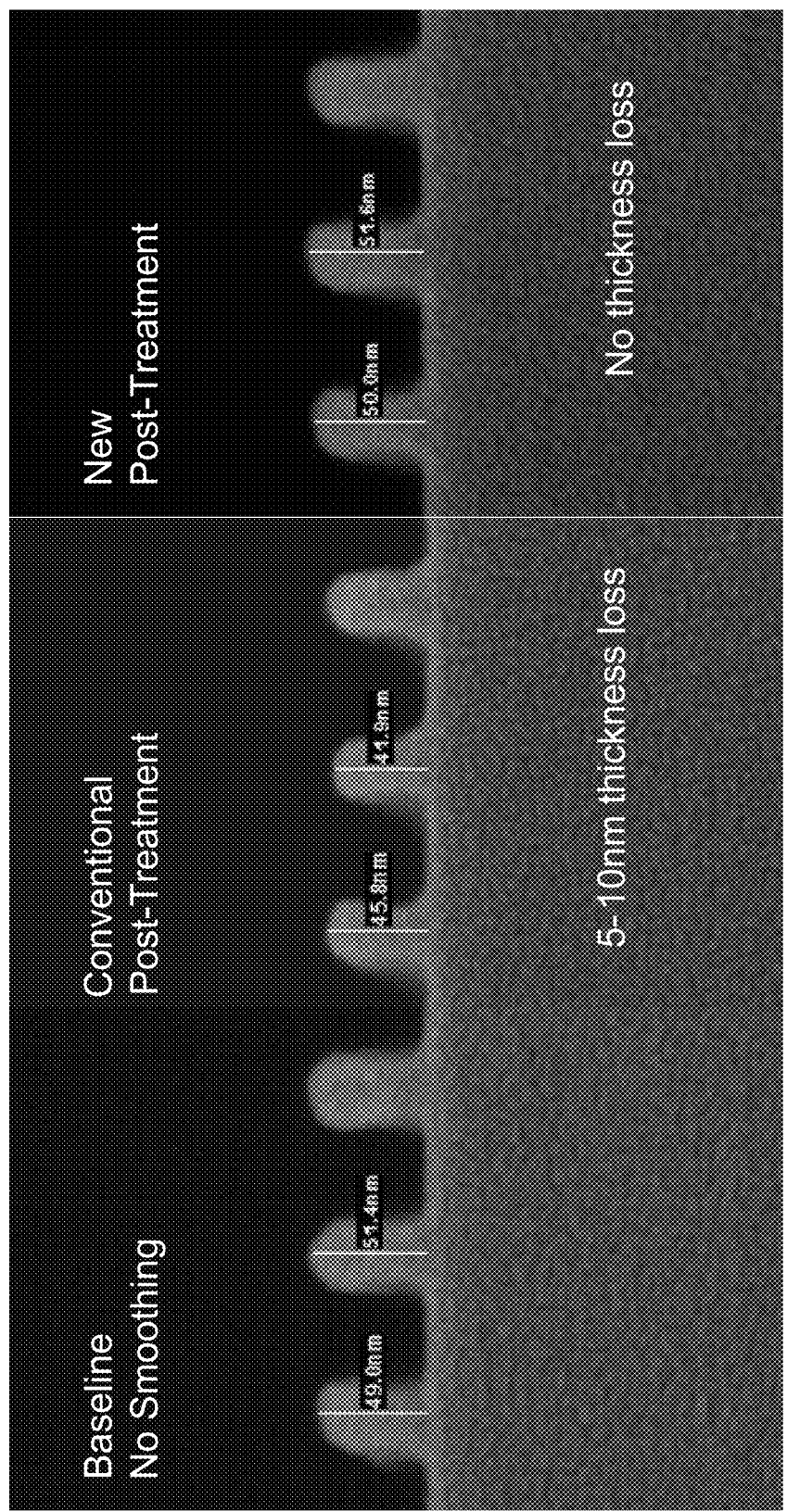

Turning now to FIG. 7, the New Post-Treatment Scheme 1 reduces thickness loss for the pattern. In the first SEM image, the thickness of the pattern varies from 49.0 nm to 51.4 nm (without smoothing). In the second SEM image using the Conventional Post-Treatment Scheme, the thickness of the pattern varies from 41.9 nm to 45.8 nm (with smoothing), thus, exhibiting a thickness loss of about 5 to 10 nm. And, in the third SEM image using the New Post-Treatment Scheme 1, the thickness of the pattern varies from 50.0 nm to 51.6 nm (with smoothing), thus showing no thickness loss.

Figure 8:
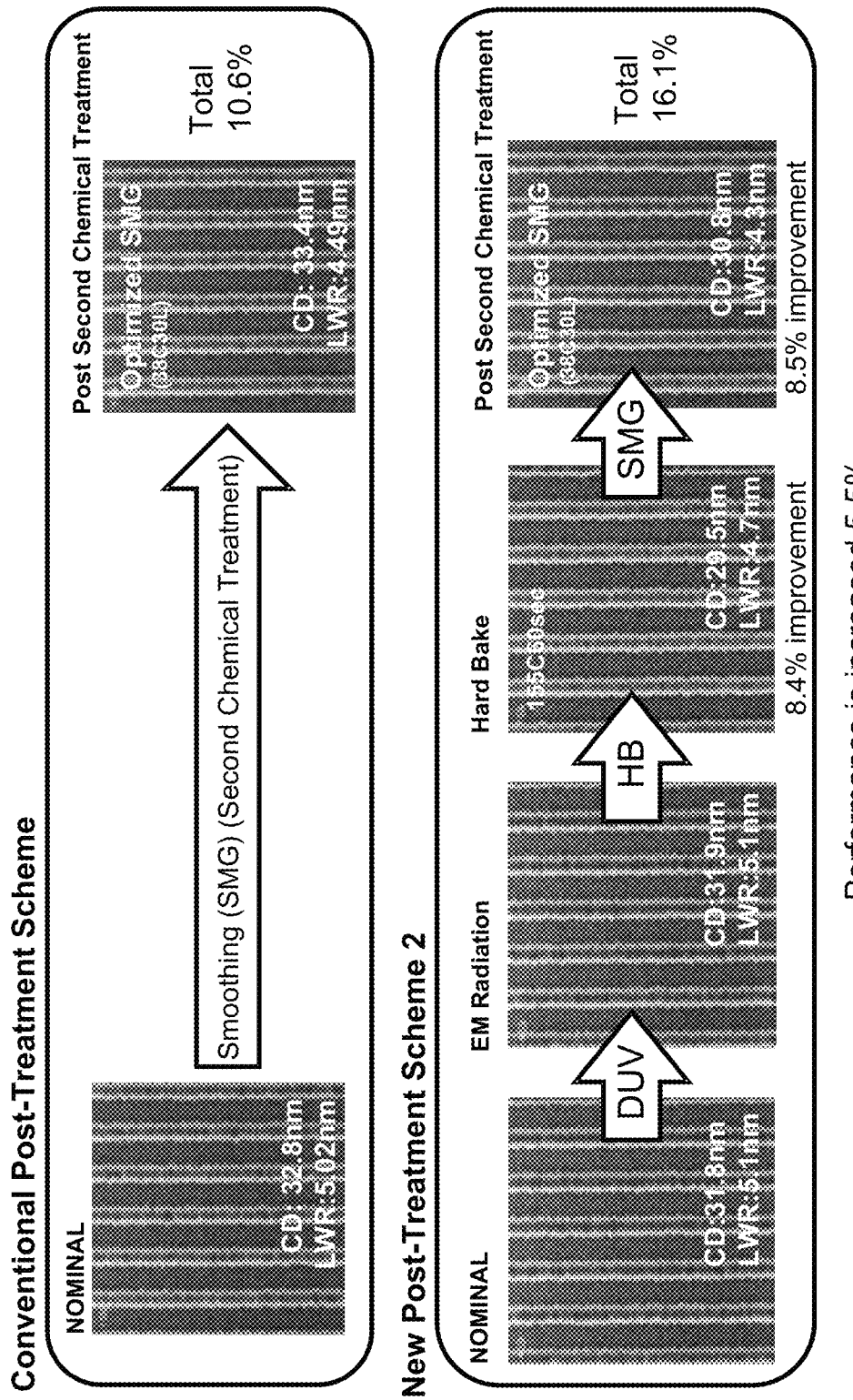

In FIG. 8, a second post-treatment scheme ("New Post-Treatment Scheme 2") is performed on a line pattern formed in an EUV resist, and compared to the result obtained for a conventional post-treatment scheme ("Conventional Post-Treatment Scheme") on the same line pattern formed in the same resist composition. The resist includes SEVR-139 (75 nm film thickness), and the line pattern has a target CD of 32 nm and a target pitch of 70 nm.

Figure 3:
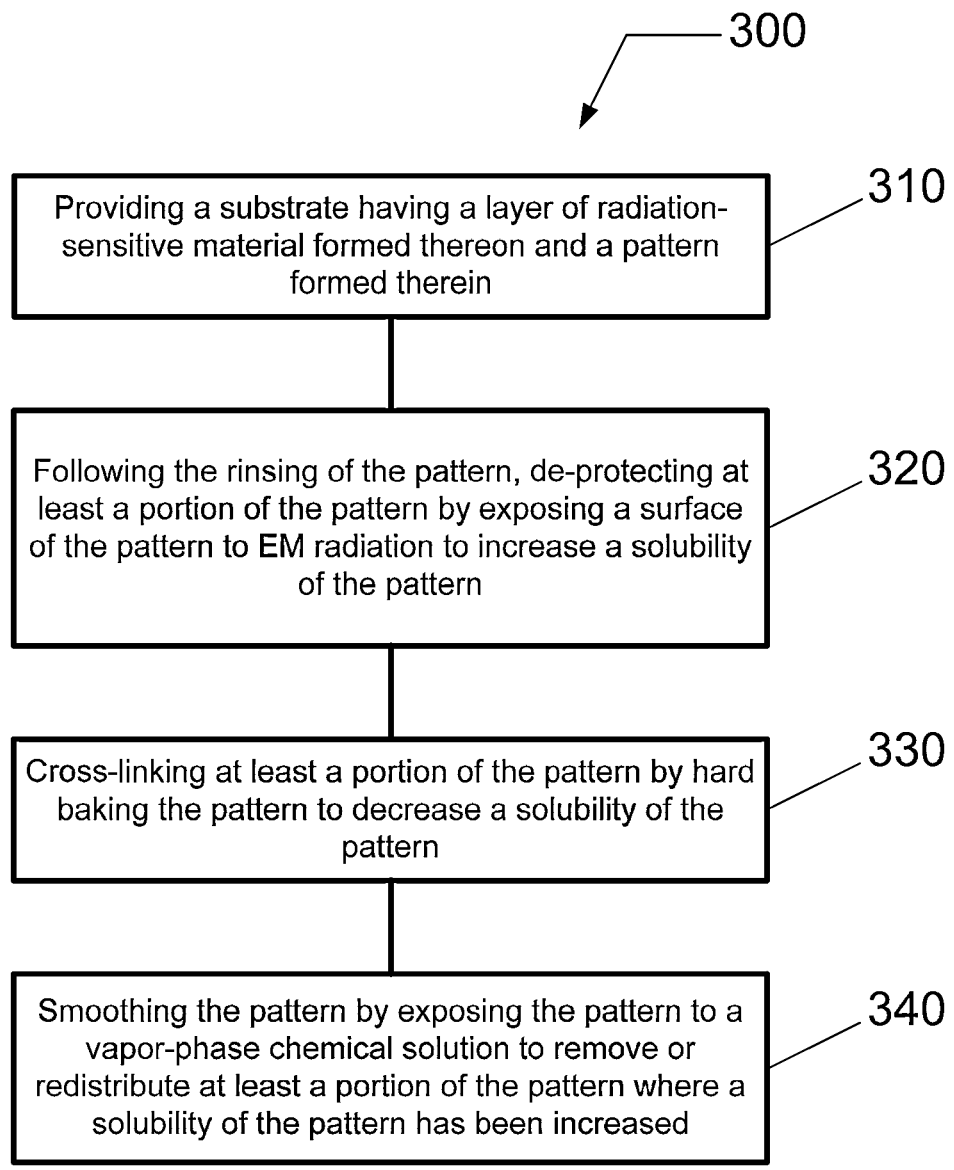
FIG. 3 illustrates a method of patterning a substrate according to yet another embodiment.

The second post-treatment scheme includes a process sequence 300 for reducing pattern roughness and deformity, as shown in FIG. 3. Process sequence 300 may include: in 310, providing a substrate having a layer of radiation-sensitive material formed thereon and a pattern formed therein, the pattern having been formed by coating the substrate with the layer of radiation-sensitive material, exposing the layer of radiation-sensitive material to first electromagnetic (EM) radiation according to an image pattern, developing the layer of radiation-sensitive material to form the pattern therein from the image pattern, and rinsing the pattern; in 320, de-protecting at least a portion of the pattern by exposing a surface of the pattern to EM radiation to increase a solubility of the pattern; in 330, cross-linking at least a portion of the pattern by hard baking the pattern to decrease a solubility of the pattern; and in 340, smoothing the pattern by exposing the pattern to a vapor-phase chemical solution to remove or redistribute at least a portion of the pattern where a solubility of the pattern has been increased.

Therein, the pattern is exposed to second EM radiation (in the UV spectrum containing emission at a wavelength within the range of about 260 nm to about 350 nm) (step 320), hard baked at 155 degrees C. for 60 seconds (step 330), and exposed to NMP vapor at a substrate temperature of about 34 degrees C. to about 38 degrees C. The exposure of the pattern to the vapor-phase chemical solution may be adjusted to produce optimal results in the pattern. In the New Post-Treatment Scheme 2, the pattern is exposed to 30 loops of NMP vapor at 38 degrees C.

The conventional post-treatment scheme omits steps 320 and 330 (e.g., exposing the pattern to second EM radiation, and hard-baking the pattern), and includes only step 340 in part (i.e., smoothing the pattern by exposing the pattern to a vapor-phase chemical solution). The exposure of the pattern to the vapor-phase chemical solution may be adjusted to produce optimal results in the pattern. In the Conventional Post-Treatment Scheme, the pattern is exposed to 30 loops of NMP vapor at 38 degrees C. As shown in the SEM images of FIG. 8, when applying the Conventional Post-Treatment Scheme, the line pattern has a nominal CD of 32.8 nm and a nominal LWR of 5.02 nm. After application of the Conventional Post-Treatment Scheme, the final CD is 33.4 nm and the final LWR is 4.49 nm, which represents a 10.6% reduction of the LWR (measured as the percentile ratio of the difference between the final LWR and nominal LWR relative to the nominal LWR).

For comparison, after application of the New Post-Treatment Scheme 2, the final CD is 30.8 nm and the final LWR is 4.30 nm, which represents a 16.1% reduction of the LWR (measured as the percentile ratio of the difference between the final LWR and nominal LWR relative to the nominal LWR). The New Post-Treatment Scheme 2 improves the reduction of LWR by 5.5%.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for patterning a substrate, comprising:
providing a substrate having a layer of radiation-sensitive material formed thereon and a pattern formed therein, said pattern having been formed by coating said substrate with said layer of radiation-sensitive material, exposing said layer of radiation-sensitive material to first electromagnetic (EM) radiation according to an image pattern, developing said layer of radiation-sensitive material to form said pattern therein from said image pattern, and rinsing said pattern; and
post-treating said pattern in said layer of radiation-sensitive material to reduce a roughness of said pattern, said post-treating comprising:
   (a) performing a treatment process on said pattern to alter a solubility of an exposed surface of said pattern, said performing said treatment process (a) including, in either order:
      (a)(1) performing a first chemical treatment of said pattern using a liquid-phase chemical solution, said liquid-phase chemical solution containing a first surfactant selected to reduce line edge roughness (LER) and/or line width roughness (LWR), and
      (a)(2) performing a second chemical treatment of said pattern using another liquid-phase chemical solution, said another liquid-phase chemical solution containing a second surfactant selected to reduce pattern collapse,
   (b) following said performing said treatment process (a), hard baking said pattern at a hard bake temperature that is less than the glass transition temperature of said layer of radiation-sensitive material, and
   (c) following said hard baking (b), performing a third chemical treatment of said pattern using a vapor-phase chemical solution.

2. The method of claim 1, wherein said hard bake temperature is greater than or equal to a post-exposure bake (PEB) temperature for a PEB process that follows said exposing to said image pattern of said first EM radiation and precedes said developing.

3. The method of claim 1, wherein said hard bake temperature ranges from about 150 degrees C. to about 170 degrees C.

4. The method of claim 1, wherein said performing said third chemical treatment (c) of said pattern using said vapor-phase chemical solution includes exposing said pattern to a treatment vapor, said treatment vapor containing N-Methylpyrrolidone or N-Methyl-2-pyrrolidone.

5. The method of claim 1, further comprising:
following performing said third chemical treatment (c), exposing said substrate to one or more additional vapor-phase treatment solutions to further reduce said reduced roughness.

6. The method of claim 1, wherein said performing said third chemical treatment (c) of said pattern using said vapor-phase chemical solution further includes heating said substrate while using said vapor-phase chemical solution.

7. The method of claim 1, further comprising:
characterizing said roughness by determining a pre-smoothing roughness assessed immediately prior to said post-treating of said pattern and determining a post-smoothing roughness assessed immediately following said post-treating of said pattern; and
achieving a reduction in said roughness exceeding 10%, said reduction in said roughness measured as a percentile ratio of a difference between said pre-smoothing roughness and said post-smoothing roughness to said pre-smoothing roughness.

8. The method of claim 1, further comprising:
characterizing said roughness by determining a pre-smoothing roughness assessed immediately prior to said post-treating of said pattern and determining a post-smoothing roughness assessed immediately following said post-treating of said pattern; and
achieving a reduction in said roughness exceeding 20%, said reduction in said roughness measured as a percentile ratio of a difference between said pre-smoothing roughness and said post-smoothing roughness to said pre-smoothing roughness.

9. The method of claim 1, wherein said rinsing of said pattern following said developing of said pattern comprises rinsing said pattern with deionized water.

10. The method of claim 1, further comprising:
following performing said third chemical treatment (c), baking said pattern.

11. A method for patterning a substrate, comprising:
providing a substrate having a layer of radiation-sensitive material formed thereon and a pattern formed therein, said pattern having been formed by coating said substrate with said layer of radiation-sensitive material, exposing said layer of radiation-sensitive material to first electromagnetic (EM) radiation according to an image pattern, developing said layer of radiation-sensitive material to form said pattern therein from said image pattern, and rinsing said pattern with deionized water;
following said rinsing of said pattern, promoting swelling of at least a first portion of said pattern by exposing a surface of said pattern to a liquid-phase chemical solution containing a surfactant to increase a solubility of said first portion of said pattern;
cross-linking at least a second portion of said pattern by hard baking said pattern to decrease said solubility of said second portion of said pattern; and
smoothing said pattern by exposing said pattern to a vapor-phase chemical solution to remove or redistribute at least said first portion of said pattern where said solubility of said first portion of said pattern has been increased.

12. The method of claim 11, further comprising:
following said smoothing, baking said pattern.

13. The method of claim 11, wherein said exposing said surface of said pattern to said liquid-phase chemical solution includes exposure to two liquid-phase chemical solutions, each containing a different surfactant.

14. The method of claim 13, further comprising:
selecting a first surfactant for one of the two liquid-phase chemical solutions to reduce line edge roughness (LER) and/or line width roughness (LWR); and
selecting a second surfactant for the other of the two liquid-phase chemical solutions to reduce pattern collapse.

15. A method for patterning a substrate, comprising:
providing a substrate having a layer of radiation-sensitive material formed thereon and a pattern formed therein, said pattern having been formed by coating said substrate with said layer of radiation-sensitive material, exposing said layer of radiation-sensitive material to first electromagnetic (EM) radiation according to an image pattern, developing said layer of radiation-sensitive material to form said pattern therein from said image pattern, and rinsing said pattern with deionized water;
following said rinsing of said pattern, de-protecting at least a first portion of said pattern by exposing a surface of said pattern to second EM radiation to increase a solubility of said first portion of said pattern;
cross-linking at least a second portion of said pattern by hard baking said pattern to decrease said solubility of said second portion of said pattern; and
smoothing said pattern by exposing said pattern to a vapor-phase chemical solution to remove or redistribute at least said first portion of said pattern where said solubility of said first portion of said pattern has been increased.

16. The method of claim 15, wherein said second EM radiation comprises ultraviolet (UV) radiation.

17. The method of claim 15, wherein said second EM radiation comprises ultraviolet (UV) radiation ranging in wavelength from about 260 nm to about 350 nm.

18. The method of claim 17, wherein said second EM radiation comprises a flood exposure of said layer of radiation-sensitive material on said substrate to said second EM radiation.

19. The method of claim 15, further comprising:
following said smoothing, baking said pattern.

* * * * *